United States Patent [19]

Smith

[11] 4,250,053

[45] Feb. 10, 1981

[54] SENSITIZED AROMATIC IODONIUM OR AROMATIC SULFONIUM SALT PHOTOINITIATOR SYSTEMS

[75] Inventor: George H. Smith, Maplewood, Minn.

[73] Assignee: Minnesota Mining and Manufacturing Company, Saint Paul, Minn.

[21] Appl. No.: 40,645

[22] Filed: May 21, 1979

[51] Int. Cl.$^3$ .......................... B01J 31/02; B01J 31/12
[52] U.S. Cl. ............................... 252/426; 204/159.18; 204/159.23; 204/159.24; 252/429 R; 252/431 R; 252/431 N; 430/280; 430/281
[58] Field of Search .................... 204/159.18, 159.23, 204/159.24; 252/426, 431 R, 431 N, 429 R; 430/280, 281

[56] References Cited

U.S. PATENT DOCUMENTS

| | | | |
|---|---|---|---|
| 3,879,463 | 4/1975 | Peters et al. | 260/571 |
| 3,947,337 | 3/1976 | Peters et al. | 204/159.15 |
| 3,991,049 | 11/1976 | Siegrist et al. | 260/240 D |
| 4,026,705 | 5/1977 | Crivello et al. | 204/159.23 |
| 4,058,400 | 11/1977 | Crivello | 204/159.18 |
| 4,058,401 | 11/1977 | Crivello | 204/159.18 |
| 4,069,054 | 1/1978 | Smith | 96/115 P |

*Primary Examiner*—Jack P. Brammer
*Attorney, Agent, or Firm*—Cruzan Alexander; Donald M. Sell; Mark A. Litman

[57] ABSTRACT

Iodonium and sulfonium photoinitiators are naturally sensitive to only a small portion of the electromagnetic spectrum.

Various classes of sensitizing dyes for iodonium and sulfonium salts are disclosed herein.

17 Claims, No Drawings

SENSITIZED AROMATIC IODONIUM OR AROMATIC SULFONIUM SALT PHOTOINITIATOR SYSTEMS

BACKGROUND OF THE INVENTION

This invention relates to iodonium and sulfonium compounds and, more particularly, to photosensitization of aromatic iodonium and sulfonium photoinitiators.

Iodonium and sulfonium salts are known to absorb ultraviolet light only at wavelengths below about 300 nm, and their absorption spectra are essentially independent of the anion portion of the molecule. This limited spectral response is accordingly a serious inherent limitation with respect to their use as photoinitiators in photosensitive compositions. For example, in the field of graphic arts, such as in the preparation of printing plates, a photographic film negative is disposed between the lamp and the photosensitive plate. This film negative prevents the transmission of appreciable light of wavelengths below about 340 nm. Furthermore, when photosensitive compositions are used as photocurable coatings, light of wavelengths below about 300 nm decreases in intensity as it passes through the coating, due to absorption of the light by the monomeric compounds, pigments, binders, etc., present in the coating. Either occurrence would reduce the usefulness of sulfonium and iodonium photoinitiators because of their limited spectral response.

Although there are dozens of known classes of dyes and other materials which can be used to broaden the spectral response of photosensitive compositions, it has not been possible to predict which materials would be useful in sensitizing aromatic iodonium and sulfonium salts. In fact, it has been found that only select materials are useful in sensitizing these aromatic salts. For example, a well known and widely used class of energy transfer sensitizers, known as triplet sensitizers, e.g., benzophenone, acetophenone, etc., are not significantly effective for sensitizing aromatic sulfonium and iodonium salts. U.S. Pat. No. 4,069,054 discloses certain amines and heterocyclic compounds which are useful sensitizers for sulfonium photoinitiators. U.S. Pat. No. 4,026,705 also discloses sensitizers for iodonium photoinitiators.

SUMMARY OF THE INVENTION

In accordance with the present invention there is provided a photosensitive admixture comprising an aromatic iodonium or sulfonium compound and a sensitizing compound selected from the class of polyarylenes, polyarylpolyenes, 2,5-diphenylisobenzofurans, 2,5-diarylcyclopentadienes, diarylfurans, diarylthiofurans, diarylpyrrols, polyarylphenylenes, coumarins, and polyaryl-2-pyrazolines.

There are many advantages associated with sensitized aromatic sulfonium compounds. For example, in photosensitive compositions the speed of light curing is increased, and safer and less expensive exposure lamps may be used effectively.

DETAILED DESCRIPTION OF THE INVENTION

Aromatic sulfonium compounds which can be sensitized in accordance with this invention include those having the formulae:

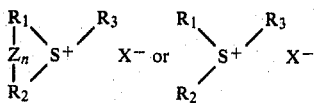

wherein $R_1$, $R_2$, and $R_3$ can be the same or different provided that at least one of such groups is aromatic. Such groups can be selected from aromatic groups having 4 to 20 carbon atoms (e.g., substituted or unsubstituted phenyl, naphthyl, thienyl, and furanyl. Substitution may be with such groups as alkoxy, alkylthio, arylthio, halogens, etc., and alkyl radicals having 1 to 20 carbon atoms. The term "alkyl" as used here is meant to include substituted alkyl radicals (for example, with substituents such as halogen, hydroxy, alkoxy, aryl). Preferably, $R_1$, $R_2$ and $R_3$ are each aromatic. Z is selected from the group consisting of oxygen; sulfur;

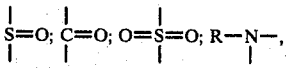

where R is aryl (of 6 to 20 carbons, such as phenyl) or acyl (of 2 to 20 carbons, such as acetyl, benzoyl, etc.); a carbon-to-carbon bond; or

where $R_4$ and $R_5$ are selected from the group consisting of hydrogen, an alkyl radical having 1 to 4 carbon atoms, and an alkenyl radical having 2 to 4 carbon atoms; and n is zero or 1; and $X^-$ is any anion.

Although, the particular nature of the anion, X, is not limiting or critical for the purposes of this invention (i.e., for the purposes of sensitizing the sulfonium cation), for many application it is preferred for the aromatic sulfonium compound to be in the form of a complex salt where X is selected from tetrafluoroborate, hexafluorophosphate, hexafluoroarsenate, hexafluoroantimonate, and hydroxypentafluoroantimonate (e.g., for photoinitiation of cationically polymerizable materials such as epoxy resins or epoxy resins and polyols).

Aromatic sulfonium salts are known and recognized in the art. Triaryl-substituted sulfonium compounds, for example, can be prepared by the procedures described in C. H. Wiegand et al., "Synthesis and Reactions of Triarylsulfonium Halides", J. Org. Chem. 33, 2671–75 (1968). Aromatic sulfonium salts also having alkyl-substitution can be prepared by the procedures described in K. Ohkubo et al., J. Org. Chem. 36, 3149–55 (1971). The preferred method for making triaryl-substituted sulfonium compounds is described in U.S. Pat. No. 2,807,648, incorporated herein by reference, from which complex sulfonium salts can be made. The complex sulfonium salts can be prepared from the corresponding simple salts, such as the bisulfate or halide salts, by metathesis with a metal or ammonium salt or acid of the complex anion desired.

The sulfonium complex salts are substituted with at least one, and preferably three, aromatic groups. Representative groups are aromatic groups having 4 to 20 carbon atoms and are selected from phenyl, thienyl and furanyl groups. These aromatic groups may optionally have one or more fused benzo rings (e.g., naphthyl and the like; benzothienyl, dibenzothienyl; benzofuranyl, dibenzofuranyl; etc.). Such aromatic groups may also be substituted, if desired, by one or more of the following groups, or by other groups which are essentially nonreactive with other components present in the particular composition in which the complex salt is to be used: halogen, nitro, aryl, ester groups (e.g., alkoxycarbonyl such as methoxycarbonyl and ethoxycarbonyl, phenoxycarbonyl and acyloxy such as acetoxy and propionyloxy), alkoxy groups (e.g., methoxy, ethoxy, butoxy, and the like), aryl groups (e.g., phenyl), alkyl groups (e.g., methyl, ethyl, t-butyl and the like) aryloxy groups (e.g., phenoxy), alkyl-sulfonyl (e.g., methylsulfonyl, ethylsulfonyl, and the like) arylsulfonyl groups (e.g., phenylsulfonyl groups), hydrocarbylthio groups (e.g., p-phenylthio, methylthio, etc.), perfluoroalkyl groups (e.g., trifluoromethyl, perfluoroehtyl, and the like), and perfluoroalkylsulfonyl groups (e.g., trifluoromethylsulfonyl, perfluorobutylsulfonyl, and the like).

Examples of suitable aromatic sulfonium complex salt photoinitiators include:
triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluorophosphate
tri(4-phenoxyphenyl)sulfonium hexafluorophosphate
di(4-ethoxyphenyl)methylsulfonium hexafluoroarsenate
4-acetonylphenyldiphenylsulfonium tetrafluoroborate
4-thiomethoxyphenyldiphenylsulfonium hexafluorophosphate
di(methoxysulfonylphenyl)methylsulfonium hexafluoroantimonate
di(nitrophenyl)phenylsulfonium hexafluoroantimonate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
p-(phenylthiophenyl)diphenylsulfonium hexafluoroantimonate
10-methylphenoxathiinium hexafluorophosphate
5-methylthianthrenium hexafluorophosphate
10-phenyl-9,9-dimethylthioxanthenium hexafluorophosphate
10-phenyl-9-oxothioxanthenium tetrafluoroborate
5-methyl-10-oxothianthrenium tetrafluoroborate
5-methyl-10,10-dioxothianthrenium hexafluorophosphate Of the aromatic sulfonium complex salts which are used in this invention the preferred salts are the triaryl-substituted salts such as triphenylsulfonium hexafluorophosphate, p-(phenylthio)phenyldiphenylsulfonium hexafluoroantimonate and triphenylsulfonium hexafluoroantimonate. The triaryl-substituted salts are preferred because they are more thermally stable than the mono- and diaryl substituted salts and accordingly may be used in one-part curable systems where long shelf life is desired. The triaryl-substituted complex salts are also more amenable to dye sensitization in accordance with this invention.

Aromatic iodonium salts which can be sensitized in accordance with this invention include those having the formulae:

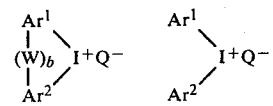

wherein
Ar$^1$ and Ar$^2$ are aromatic groups having 4 to 20 carbon atoms and are preferably selected from phenyl, naphthyl, thienyl, furanyl and pyrazolyl groups;
W is selected from

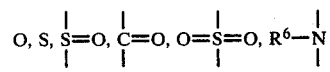

where R$^6$ is aryl of 6 to 20 carbon atoms or acyl of 2 to 20 carbon atoms (such as substituted or unsubstituted phenyl, acyl, benzoyl, etc. as described above for two sulfonium photoinitiators); a carbon-to-carbon bond; or

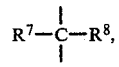

where R$^7$ and R$^8$ are selected from hydrogen, alkyl groups of 1 to 4 carbon atoms, and alkenyl groups of 2 to 4 carbon atoms; and b is zero or 1; and Q is any anion (as described above for X$^-$) and preferably a halogen-containing complex anion selected from tetrafluoroborate, hexafluorophosphate, hexafluoroarsenate, hexafluoroantimonate.

Amongst the useful iodonium salts are particularly included
diphenyliodonium iodide
diphenyliodonium hexafluoroantimonate
4-chlorophenylphenyliodonium tetrafluoroborate
di(4-chlorophenyl)iodonium hexafluoroantimonate
diphenyliodonium hexafluorophosphate
diphenyliodonium trifluoroacetate
4-trifluoromethylphenylphenyliodonium tetrafluoroborate
diphenyliodonium hexafluoroarsenate
ditolyliodonium hexafluorophosphate
di(4-methoxyphenyl)iodonium hexafluoroantimonate
di(4-methoxyphenyl)iodonium chloride
(4-methylphenyl)phenyliodonium tetrafluoroborate
di-(2,4-dimethylphenyl)iodonium hexafluoroantimonate
di-(4-t-butylphenyl)iodonium hexafluoroantimonate
2,2'-diphenyliodonium hexafluorophosphate.

The amount of latent photocatalytic onium salt used in the photopolymerizable compositions of the invention is not critical but can be from about 0.01 to about 10.0% by weight of polymerizable material and preferably 0.1 to 5% by weight of the total weight of polymerizable material. The use of greater amounts of onium salt generally does not afford increased polymerization and the use of less tends to reduce the extent of polymerization. The compositions of the invention are prepared by mixing the onium salt with the polymerizable material until a solution is formed. Because some of the onium salts may have limited solubility in the polymerizable composition, it is preferable to first dissolve the onium salt in a liquid diluent that is inert to the components of the composition and then mix this solution into the polymerizable mixture. Suitable inert diluents include alcohols such as ethanol, ketones such as acetone, halohydrocarbons such as dichloromethane.

The compositions of the invention can be used for preparation of coatings for various substrates; however, adhesives, sealants, binders and rubbers can also be prepared from the compositions of the invention and are particularly useful where such materials need be polymerized in situ by irradiation. The compositions of the invention can be applied to substrates by spraying, brushing, dipping, roller coating, flow coating or any of the methods used in commercial coating operations.

The compositions of the invention may contain certain additives to alter the properties of the polymerized or cured product. Thus, there may be added dyes, pigments, plasticizers, fillers and the like as long as these materials do not prevent sufficient penetration into the composition by radiation absorbed by the sensitizer.

The polymerization or curing of the composition is a triggered reaction, i.e., once degradation of the photocatalytic onium salt has been initiated, the polymerization or curing proceeds and will continue even after terminating radiation. The use of thermal energy during or after exposure to radiation greatly accelerates polymerization or curing.

Generally speaking, the sensitized aromatic iodonium and sulfonium complex salts are significantly useful as photoinitiators for cationic reactions (such as polymerization of cationically polymerizable monomers). For example, the sensitized complex salts with appropriate anions are particularly suitable as photoinitiators for the polymerization or copolymerization of cationically polymerizable monomers such as epoxides (epoxy resins), epoxides and polyols, oxetanes, vinyl ethers, lactones, etc. The sensitized complex salts are also useful as photoinitiators for free-radical polymerization (e.g., polymerization of vinyl or acrylic monomers and others such as acrylate esters, acrylamide esters, acrylonitrile, styrene, butadiene, vinylidenes, etc.) and polymerization by hydrolysis of silanes (as in U.S. Pat. No. 4,101,513).

Generally speaking, the amount of sensitizer used in the practice of this invention is about 0.01 to 10 parts, and preferably about 0.1 to 1 part, by weight of sensitizer per part of aromatic complex salt. Factors to consider in determining the amount of sensitizer to be included in a given composition include intended light exposure conditions, thickness of the composition to be cured, solubility of the sensitizer in the composition, and other factors normally considered in the utilization of sensitizers. Of course, more than one photoinitiator and/or sensitizer may be used in a single composition.

The sensitizing compounds of the present invention are fluorescent polyaryl compounds selected from the group consisting of polyarylenes, polyarylpolyenes, 2,5-diphenylisobenzofurans, 2,5-diarylfurans, 2,5-diarylthiofurans, 2,5-diarylpyrroles, 2,5-diarylcyclopentadienes, polyarylphenylenes, coumarins, and polyaryl-2-pyrazolines. These compounds may be partially described by the following general formulae:

$$R^9\text{—}Q\text{—}R^{10} \qquad \text{I}$$

wherein
R$^9$ and R$^{10}$ are independently selected from aryl groups comprising phenyl, napthyl, biphenyl, 2-furanyl groups (all of which may be substituted or not), and
Q is

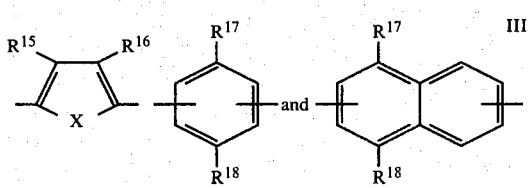

wherein
R$^{11}$, R$^{12}$ and R$^{13}$ are independently H or a phenyl group (i.e., substituted or not), and is preferably H,
R$^{14}$ is selected from —CH=CH—,

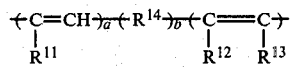

wherein
R$^{15}$ and R$^{16}$ are H, methyl, methoxy, or phenyl when X is O, and H or phenyl when X=S,

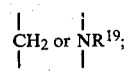

R$^{17}$ and R$^{18}$ are H or a styryl group (i.e., substituted or not), or a stilbenyl groups (i.e., substituted or not);
X is O, S,

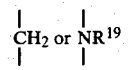

where R$^{19}$ is H or phenyl; a and c are independently 0 or 1; and
b is 0, 1, 2, 3, or 4 and the sum of a+b+c is 1 to 4;

$$R^{20}\text{—}R^{21} \qquad \text{IV}$$

wherein
R$^{20}$ is a 2-pyrazoline of the structure

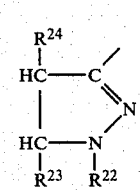

wherein
R$^{22}$ is a phenyl, biphenyl group (preferable substituents being selected from lower alkyl, lower alkoxy, halogen, lower alkylamino, alkylsulfonyl, p-acetamido, sulfonamido, and carbalkoxy);
R$^{23}$ and R$^{24}$ are independently H, lower alkyl, phenyl, biphenyl, or naphthyl groups (the preferred substituents on the phenyl and naphthyl group being lower alkyl, lower alkoxy, lower alkylamino, carbalkoxy, sulfonamido and acetamido; and $R^{21}$ is $R^{20}$ or phenyl, biphenyl, naphthyl, or a styryl group (substituted or not, with preferred substituents being lower alkyl, lower alkoxy, lower alkylamino, halogen and acetamido;

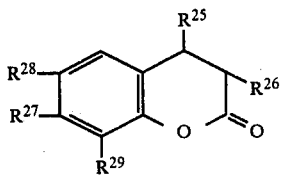

wherein $R^{25}$ is lower alkyl or perfluoro (lower) alkyl, $R^{26}$ is 2-benzothiazolyl, carboalkoxy, lower acyl (1 to 5 carbon atoms), aryl (preferably phenyl), or cyano, and $R^{25}$ and $R^{26}$ together form a 5-membered ring, $R^{27}$ is lower alkylamino, $R^{28}$ and $R^{29}$ are H or together with $R^{27}$ form a quinolizino ring fused to the phenyl ring; and

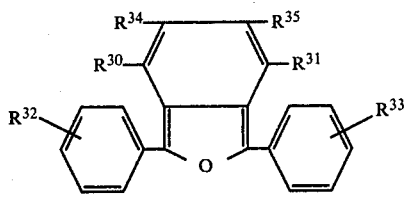

wherein $R^{30}$ and $R^{31}$ are independently H or phenyl groups, (substituted or not, e.g., with lower alkoxy), $R^{32}$ and $R^{33}$ are independently H, phenyl, (substituted or not, e.g., with lower alkoxy), lower alkyl, or lower alkoxy, and $R^{34}$ and $R^{35}$ are independently H, lower alkyl, and phenyl.

Where the term "lower" is used in desribing an organic group it means that there are no more than 5 carbon atoms present in the lower group.

There are a number of different classes of compounds which may be used as photosensitizers according to the practice of the present invention. These classes include, for example, the polyarylenes, the 1,3-diaryl-2-pyrazolines, the substituted coumarins, and the isobenzofurans. Examples of these compounds appear below according to their respective classes. The examples refer to these compounds by their numbers.

A. Polyarylenes 1. p,p'-dimethoxystilbene
2. 1,4-diphenyl-1,3-butadiene
3. 1-phenyl-4-(chlorophenyl)-1,3-butadiene
4. 1,4-bis-(p-methoxyphenyl)-1,3-butadiene
5. 1,4-bis-(p-tolyl)-1,3-butadiene
6. 1,1,4,4-tetraphenyl-1,3-butadiene
7. 1,6-diphenyl-1,3,5-hexatriene
8. 1-(2-naphthyl)-4-phenyl-1,3-butadiene
9. 1-(2-furyl)-4-phenyl-1,3-butadiene
10. 1,4-di-(2-naphthyl)-1,3-butadiene
11. 1-(p-biphenyl)-1,3-butadiene
12. 1,8-diphenyl-1,3,5,7-octatetraene
13. 1,4-di-(2-methylstyryl)benzene
14. 1,3,5-tristyrylbenzene
15. 2,6-distyrylnaphthalene
16. 4-styryl-p-biphenyl
17. 1,3,5-tris-(p-methoxystyryl)-benzene
18. 1,3,4-tri-(p-methoxystyryl)-benzene
19. 1,2-di-(3,4-dimethoxystyryl)-benzene
20. 1,3,5-tri-(p-methoxystilbenyl)-benzene
21. 1,1-diphenyl-2-(p-methoxystilbenyl)-ethylene
22. 1,3-di-(p-methoxystyryl)-naphthalene
23. 2,5-diphenylfuran
24. 2,5-distyrylfuran
25. 2,3,4,5-tetraphenylfuran
26. 2,5-diphenyl-3-methoxyfuran
27. 2,5-diphenyl-4-methylfuran
28. 2,5-diphenylthiophene
29. 2,5-distyrylthiophene
30. 2,5-diphenylpyrrole
31. 1,2,5-triphenylpyrrole
32. 2,3,4,5-tetraphenylpyrrole
33. 1,2,3,4-tetraphenylcyclopentadiene The above compounds can be prepared by referring to the following procedures:

Y. Hirshberg et al J.A.C.S., 72, 5120 (1950)
A. Siegrist et al U.S. Pat. No., 3,991,049 (260/240D)
E. Seus, J. Het. Chem., 2, 318 (1965)
S. King et al, J. A. C. 5, 73, 2253 (1951)

B. 1,3-diaryl-1-pyrazolines 34. 1,3-diphenyl-2-pyrazoline
35. 1-p-methoxyphenyl-3-phenyl-2-pyrazoline
36. 1-phenyl-3-p-cyanophenyl-2-pyrazoline
37. 1-phenyl-3-styryl-2-pyrazoline
38. 1-naphthyl-3-phenyl-2-pyrazoline
39. 1-p-chlorophenyl-3-phenyl-2-pyrazoline
40. 1-m-chlorophenyl-3-(2,4-dimethoxyphenyl)-2-pyrazoline
41. 1-(3,4-dichlorophenyl)-3-phenyl-2-pyrazoline
42. 1-p-methylsulfonylphenyl)-3-phenyl-2-pyrazoline
43. 1-p-acetamidophenyl-3-phenyl-2-pyrazoline
44. 5-isopropyl-1,3-diphenyl-2-pyrazoline
45. 1-p-tolyl-3-phenyl-2-pyrazoline
46. 1-p-carbomethoxyphenyl-3-phenyl-2-pyrazoline
47. 1,3-diphenyl-5-p-acetamidophenyl-2-pyrazoline
48. 1,3,4,5-tetraphenyl-2-pyrazoline
49. 1,5-diphenyl-3-styryl-2-pyrazoline
50. 1-phenyl-3-(p-methoxystyryl)5-(p-methoxyphenyl)-2-pyrazoline
51. 1-phenyl-3-(-diethylaminostyryl)-5-(diethylaminophenyl)-2-pyrazoline
52. 1-(p-methoxyphenyl)-3-(p-diethylaminostyryl)-5-(diethylaminophenyl)-2-pyrazoline
53. 1,1'-diphenyl3-3'-bis-2-pyrazoline
54. 1-p-biphenyl-3,5-diphenyl-2-pyrazoline
55. 1-phenyl-3-(2-naphthyl-5-(p-biphenyl)-2-pyrazoline
56. 1,3-diphenyl-5-(9-anthryl)-2-pyrazoline
57. 1-phenyl-3-(p-biphenyl-5-(p-isopropylphenyl)-2-pyrazoline
58. 1,3-diphenyl-5-naphthyl-2-pyrazoline These compounds can be preared by referring to the following publications:

A. Wagner et al, Angew. Chem. Int. Ed., 5,699 (1966)
R. H. Wiley et al, J. Org. Chem., 23, 732 (1958)
N. A. Evans et al, Aust. J. Chem., 27, 2267 (1974)
R. Maruyama et al, Chem. Abst. 65, 13850 (1966)
Neth. Appl. 6,506,722, Chem. Abst., 64, 19851c (1966)

C. Isobenzofurans 59. 1,3-diphenylisobenzofuran
60. 1,3-diphenyl-4,7-di-(p-methoxyphenyl)isobenzofuran
61. 1,3-di-(p-methoxyphenyl)-3,6-diphenylisobenzofuran
62. 1,3,4,7-tetra-(p-methoxyphenyl)isobenzofuran
63. 1,3,4,7-tetraphenylisobenzofuran
64. 1,3-di-(p-methoxyphenyl)isobenzofuran
65. 1,3-di-(p-biphenyl)isobenzofuran
66. 1,3-diphenyl-5,6-dimethylisobenzofuran
67. 1,2-diphenyl-5-methylisobenzofuran
68. 1,3,5,6-tetraphenylisobenzofuran
69. 1,3-di-(p-biphenyl)-4,7-diphenylisobenzofuran
70. 1,3,4,7-tetra-(p-methoxyphenyl)isobenzofuran These compounds are prepared by methods described in:
A. Zweig et al, J. Am. Chem. Soc., 89, 4091 (1967)
R. Adams and M. H. Gold., J. Am. Chem. Soc., 62, 2038 (1940)

D. Substituted Coumarins 71. 7-diethylamino-4-methylcoumarin
72. 7-dimethylamino-4-trifluoromethylcoumarin
73. 7-diethylamino-3,4-cyclopentylcoumarin
74. 7-dimethylamino-3-phenylcoumarin
75. 3-(2'-benzothiazolyl)-7-diethylaminocoumarin
76. 7-methoxy-4-methylcoumarin
77. 1,2,4,5,3H,6H,10H-tetrahydro-9-carbethoxy-[1]-benzopyrano-(9,9a,1-gh)quinolizin-10-one
78. 1,2,4,5,3H,6H,10H-tetrahydro-9-cyano-[1]-benzopyrano-(9,9a,1gh)quinolizin-10-one
79. 1,2,4,5,3H,6H,10H-tetrahydro-9-acetyl-[1]-benzopyrano-(9,9a-1-gh)quinolizin-10-one The above compounds are commercially available.

The invention is further illustrated by means of the following examples wherein the term "parts" refers to parts by weight unless otherwise indicated.

EXAMPLES 1–9

A stock solution was prepared from 50 parts of a 5% by weight solution of polyvinylbutyral in tetrahydrofuran, 0.5 parts of 3,4-epoxycyclohexylmethyl-3,4-epoxycyclohexane carboxylate, and 0.2 parts of diphenyl iodonium hexafluorophosphate. To 5 parts of this solution was added $5 \times 10^{-5}$ moles of sensitizer described in the present invention. These solutions were then knife coated ($5 \times 10^{-2}$ mm wet) onto a polyester film base then oven dried at 60° C. for 5 minutes. The dried film samples were then exposed to a 500 watt ultraviolet lamp at a distance of 17.8 cm through a photographic step wedge in contact with the film side of the sample. After exposure, each sample was well sprayed with methanol to wash away the soluble unpolymerized material. Table I (under Exposure Time) shows the number of solid, insoluble steps remaining after the spraying. This provides a relative measure of the cure rate and sensitivity of the solutions.

TABLE I

| Example | Sensitizer | Exposure Time (min.) | | |
|---|---|---|---|---|
| | | 0.25 | 0.50 | 1.0 |
| 1 | none | 0 | 0 | 0 |
| 2 | 1 | 0 | 2 | 4 |
| 3 | 2 | 0 | 1 | 6 |
| 4 | 4 | 0 | 1 | 3 |
| 5 | 6 | 1 | 5 | 8 |
| 6 | 7 | 6 | 8 | >10 |
| 7 | 8 | 2 | 6 | >10 |
| 8 | 12 | 0 | 0 | 3 |
| 9 | 13 | 1 | 3 | 6 |

EXAMPLES 10–15

A stock solution was prepared from 20 parts of an epoxy cresol novolac resin (having a melting point of 85°–90° C. and an epoxide equivalent weight of 235), 30 parts acetone, and 0.4 parts of triphenylsulfonium hexafluorophosphate. To 5 parts of this solution was added 0.013 parts of various sensitizers according to the present invention. The solutions were then coated, dried, and exposed as in Examples 1–9. Table II shows the number of solid steps remaining after washing thoroughly with acetone.

TABLE II

| Example | Sensitizer | Exposure Time (min.) | |
|---|---|---|---|
| | | 5 | 10 |
| 10 | none | 0 | 0 |
| 11 | 7 | 7 | |
| 12 | 8 | 8 | |
| 13 | 34 | 7 | |
| 14 | 28 | 3 | |
| 15 | 59 | 7 | |

EXAMPLES 16–21

The stock solution of Examples 1–9 with 0.2 g of diphenyliodonium hexafluoroarsenate in place of the earlier photoinitiator was used in the following examples. To 5 parts of this solution were added 0.01 parts of a sensitizer of this invention. These solutions were coated, dried, exposed and washed as in Examples 1–9. Table III shows the number of solid steps remaining after washing with methanol.

TABLE III

| Example | Sensitizer | Exposure Time (min). | | | |
|---|---|---|---|---|---|
| | | 1.5 | 2.0 | 3.0 | 10 |
| 16 | none | 0 | 0 | 0 | 0 |
| 17 | 71 | 0 | 0 | 4 | |
| 18 | 72 | 8 | >10 | | |
| 19 | 75 | 0 | 0 | 2 | |
| 20 | 77 | 6 | 8 | | |
| 21 | 79 | 7 | 9 | | |

EXAMPLES 22–35

A stock solution was prepared from 100 parts of a 5% by weight solution of polyvinyl butyral in tetrahydrofuran, 1.0 parts of 3,4-epoxycyclohexylmethyl-3,4-epoxycyclohexane carboxylate, and 0.4 parts of diphenyliodium tetrafluoroborate (DPIT), tri(p-methoxyphenyl)-sulfonium hexafluorophosphate (TMSH), or diphenylmethylsulfonium hexafluorophosphate (DPSH). To 5 gram portions of these solutions were added 10 mg of a sensitizer of the present invention. These solutions were coated, dried, exposed and washed as in Examples 1–9. The results are shown in Table IV.

TABLE IV

| Example | Onium Salt | Sensitizer | Exposure Time (min). 1 | 2 | 4 |
|---|---|---|---|---|---|
| 22 | DPIT | none | 0 | 0 | 0 (10 min) |
| 23 | DPIT | 6 | 6 | | |
| 24 | DPIT | 28 | 4 | | |
| 25 | DPIT | 34 | 10 | | |
| 26 | TMSH | none | 0 | 0 | 0 (10 min) |
| 27 | TMSH | 16 | | | 2 |
| 28 | TMSH | 21 | | | 2 |
| 29 | TMSH | 34 | | | 7 |
| 30 | TMSH | 68 | | | 3 |
| 31 | DPSH | none | 0 | 0 | 0 (10 min) |
| 32 | DPSH | 7 | | 3 | |
| 33 | DPSH | 13 | | 1 | |
| 34 | DPSH | 42 | | 7 | |
| 35 | DPSH | 59 | | 3 | |

EXAMPLES 36–40

To 5 parts of a diglycidyl ether of bisphenol A epoxy resin having an epoxide equivalent weight of 178 was added 2% by weight of a 50/50 mixture of triphenylsulfonium hexafluoroantimonate and (p-phenylthiophenyl)-diphenylsulfonium hexafluoroantimonate. This solution was then coated as in Examples 1-9. Examples of the coatings were then exposed through a Corning Glass Filter No. 0-52 (which transmits only light having a wavelength greater than 334 nm) with a 275 watt sunlamp at a distance of 12.7 cm. The exposure times required to provide a tack free surface (S) and a tack free lower portion (L) were recorded and are shown in Table V.

TABLE V

| Examples | Sensitizer | Exposure Time (min) (S) | (L) |
|---|---|---|---|
| 36 | none | 10 | 10 |
| 37 | 53 | 2 | 5 |
| 38 | 49 | 0.5 | 1 |
| 39 | 50 | 0.67 | 1.33 |
| 40 | 8 | 5 | 9 |

EXAMPLES 41–45

Examples 36-40 were repeated except that the epoxy resin was replaced by 3,4-epoxycyclohexylmethyl-3,4-epoxycyclohexane carboxylate and the photoinitiator was replaced by a 50/50 mixture of triphenylsulfonium hydroxypentafluoroantimonate and (p-phenylthiophenyl)diphenylsulfonium hydroxypentafluoroantimonate. The results are shown in Table VI.

TABLE VI

| Example | Sensitizer | Exposure Time (min) (S) | (L) |
|---|---|---|---|
| 41 | none | >10 | >10 |
| 42 | 49 | 1.5 | 3 |
| 43 | 50 | 1.5 | 3 |
| 44 | 72 | 4 | 5 |
| 45 | 79 | 2 | 4 |

EXAMPLES 46–52

A stock solution was prepared from 40 parts of 3,4-epoxycyclohexyl-3,4-epoxycyclohexane carboxylate and 0.8 parts of di-(p-tolyl)iodonium hexafluoroantimonate. 10 mg of the indicated sensitizing dyes were dissolved in 5 g portions of the stock solution and knife coated at 5.08×10$^{-2}$ mm wet on polyester film. The samples were exposed through the previously described glass filter No. 0-52 that transmits only light having a wavelength greater than 334 nm. Exposure was to the same lamp and the same distance as Examples 36-40. The results are shown in Table VII.

TABLE VII

| Example | Sensitizing Dye | Exposure Time (sec) (S) | (L) |
|---|---|---|---|
| 46 | 41 | 45 | 75 |
| 47 | 42 | 20 | 40 |
| 48 | 34 | 25 | 50 |
| 49 | 17 | 30 | 65 |
| 50* | 63 | 300 | 360 |
| 51* | 59 | 20 | 40 |
| 52 | none | >600 | >600 |

*also contains 10 mg 2,6-di-t-butyl-4-methylphenol

EXAMPLES 53–55

A stock solution of 1.3 parts of pentaerythritol triacrylate, 1.16 parts of polymethylmethacrylate, 0.13 parts of phenyl(p-methoxyphenyl)-iodonium trifluoroacetate, and 14.8 parts of acetone was prepared. 10 mg of each of the sensitizers in Table VIII were dissolved in each of 5 g samples of the stock solution and coated and evaluated as described in Examples 1-9 except exposures were made in a Colight exposure apparatus containing a 400 watt mercury lamp. Acetone was used to dissolve away the unpolymerized material. The table shows the number of steps remaining after washing.

TABLE VIII

| Example | Sensitizer | Exposure Time (min) 1.0 | 5.0 |
|---|---|---|---|
| 53 | none | 0 | 0 |
| 54 | 34 | 10 (steps) | |
| 55 | 7 | 3 (steps) | |

EXAMPLES 56–68

The Example 53-55 were exactly repeated replacing the iodonium initiator with triphenylsulfonium hexafluorophosphate. The Table IX shows the results as described above.

TABLE IX

| Example | Sensitizer | Exposure Time (min) 2.0 | 5.0 |
|---|---|---|---|
| 56 | none | 0 | 0 |
| 57 | 34 | 5 | |
| 58 | 7 | 2 | |

I claim:

1. A sensitized iodonium or sulfonium photoinitiator system comprising one part of an aromatic sulfonium salt or an aromatic iodonium salt photoinitiator associated with 0.01 to 10 parts of a fluorescent compound selected from polyarylenes, polyarylpolyenes, 2,5-diphenylisobenzofurans, 2,5-diarylfurans, 2,5-diarylthiofurans, 2,5-diarylpyrroles, 2,5-diarylcyclopentadienes, polyarylphenylenes, coumarins, and polyaryl-2-pyrazolines.

2. The sensitized photoinitiator system of claim 1 wherein the photoinitiator is a sulfonium salt of the structure

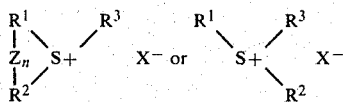

wherein
R$^1$, R$^2$ and R$^3$ are selected from aromatic groups of from 4 to 20 carbon atoms and alkyl radicals of 1 to 20 carbon atoms with at least one of R$^1$, R$^2$ and R$^3$ being an aromatic group,
Z is selected from

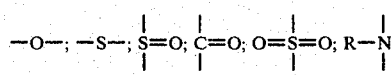

wherein R is aryl of 6 to 20 carbon atoms, or acyl of 2 to 20 carbon atoms; a carbon to carbon bond; or

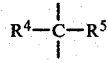

wherein R$^4$ and R$^5$ are selected from the group consisting of hydrogen, alkyl radical of 1 to 4 carbon atoms, and alkenyl radical of 2 to 4 carbon atoms;
n is 0 or 1 and
X$^-$ is an anion.

3. The sensitized photoinitiator system of claim 1 wherein the photoinitiator is an iodonium salt of the formulae:

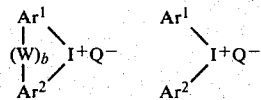

wherein
Ar$^1$ and Ar$^2$ are aromatic groups of from 4 to 20 carbon atoms; W is selected from O, S,

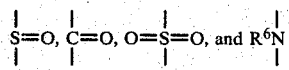

wherein
R$^6$ is an aryl of 6 to 20 carbon atoms or acyl of 2 to 20 carbon atoms, a carbon-to-carbon bond or

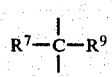

wherein R$^7$ and R$^8$ are independently selected from hydrogen alkyl groups of 1 to 4 carbon atoms, and alkenyl groups of 2 to 4 carbon atoms,
b is 0 or 1, and
Q is an anion.

4. The sensitized photoinitiator system of claim 2 wherein R$^1$, R$^2$ and R$^3$ are selected from the group consisting of phenyl, naphthyl, thionyl, and furanyl groups.

5. The sensitized photoinitiator system of claim 3 wherein Ar$^1$ and Ar$^2$ are selected from the group consisting of phenyl, naphthyl, thienyl, and furanyl groups.

6. The sensitized photoinitiator system of claim 4 wherein Q$^-$ is selected from tetrafluoroborate, hexafluorophosphate, hexafluoroantimonate, hexafluoroarsenate, and hydroxypentafluoroantimonate.

7. The sensitized photoinitiator system of claim 5 wherein Q$^-$ is selected from tetrafluoroborate, hexafluorophosphate, hexafluoroantimonate, hexafluoroarsenate, and hydroxypentafluoroantimonate.

8. A sensitized sulfonium photoinitiator system comprising one part of an aromatic sulfonium salt photoinitiator associated with 0.1 to 10 parts of a fluorescent polyarylene compound.

9. The system of claim 8 wherein said sulfonium photoinitiator is a sulfonium salt of the formula

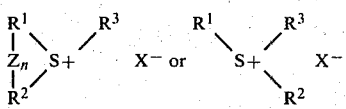

wherein
R, R$^2$ and R$^3$ are selected from aromatic groups of from 4 to 20 carbon atoms and alkyl radicals of 1 to 20 carbon atoms with at least one of R$^1$, R$^2$ and R$^3$ being an aromatic group,
Z is selected from —O—; —S—;

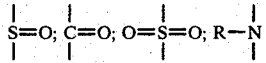

wherein R is aryl of 6 to 20 carbon atoms, or acyl of 2 to 20 carbon atoms; a carbon to carbon bond; or

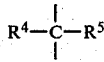

wherein R$^4$ and R$^5$ are selected from the group consisting of hydrogen, alkyl radical of 1 to 4 carbon atoms, and alkenyl radical of 2 to 4 carbon atoms;
n is 0 or 1 and
X$^-$ is an anion.

10. The system of claim 8 wherein said polyarylene compound is represented by the formula:

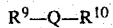

wherein
R$^9$ and R$^{10}$ are aryl groups comprising phenyl, naphthyl, biphenyl, and 2-furanyl groups, and
Q is

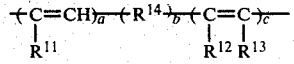

wherein $R^{11}$, $R^{12}$, and $R^{13}$ are independently H, or a phenyl group and $R^{14}$ is $-\!\!+\!\!CH\!\!=\!\!CH\!\!+\!\!-$, a is 0 or 1, b is 0, 1, 2, 3, or 4, c is 0 or 1, and the sum of a+b+c is 1 to 4.

11. The system of claim 9 wherein said polyarylene compound is represented by the formula:

$$R^9\!-\!Q\!-\!R^{10}$$

wherein $R^9$ and $R^{10}$ are aryl groups comprising phenyl, naphthyl, biphenyl, and 2-furanyl groups, and Q is

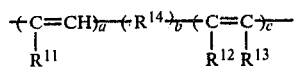

wherein $R^{11}$, $R^{12}$, and $R^{13}$ are independently H, or a phenyl group, and $R^{14}$ is $-\!\!+\!\!CH\!\!=\!\!CH\!\!+\!\!-$, a is 0 or 1, b is 0, 1, 2, 3, or 4, c is 0 or 1, and the sum of a+b+c is 1 to 4.

12. The system of claim 10 wherein a and c are 0.

13. The system of claim 11 wherein a and c are 0.

14. The system of claim 8 wherein said polyarylene compound is 1,6-diphenyl-1,3,5-hexatriene.

15. The system of claim 9 wherein said polyarylene compound is 1,6-diphenyl-1,3,5-hexatriene.

16. The system of claim 8 wherein said polyarylene compound is 1-(2-naphthyl)-4-phenyl-1,3-butadiene.

17. The system of claim 9 wherein said polyarylene compound is 1-(2-naphthyl)-4-phenyl-1,3-butadiene.

* * * * *